(12) United States Patent
Shin

(10) Patent No.: US 6,313,009 B1
(45) Date of Patent: Nov. 6, 2001

(54) FABRICATION METHOD OF SEMICONDUCTOR MEMORY DEVICE WITH IMPURITY REGIONS SURROUNDING RECESS

(75) Inventor: Bong-Jo Shin, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/395,205

(22) Filed: Sep. 14, 1999

Related U.S. Application Data

(62) Division of application No. 08/773,510, filed on Dec. 23, 1996, now Pat. No. 5,990,529.

(30) Foreign Application Priority Data

Dec. 30, 1995 (KR) .................................................. 95/68660

(51) Int. Cl.[7] .......................... H01L 21/76; H01L 21/336; H01L 29/76
(52) U.S. Cl. .......................... 438/433; 438/262; 438/270; 438/434; 257/408
(58) Field of Search .................................. 438/433, 434; 257/270, 397, 336, 390, 408

(56) References Cited

U.S. PATENT DOCUMENTS

| | | | |
|---|---|---|---|
| 4,569,701 | * | 2/1986 | Oh ........................................ 438/434 |
| 4,571,819 | * | 2/1986 | Rogers et al. ........................ 148/191 |
| 5,278,438 | * | 1/1994 | Kim et al. ............................ 257/316 |
| 5,306,941 | * | 4/1994 | Yoshida ................................ 257/590 |
| 5,424,231 | * | 6/1995 | Yang .................................... 438/270 |
| 5,424,569 | * | 6/1995 | Prall .................................... 257/401 |
| 5,436,488 | * | 7/1995 | Poon et al. .......................... 257/397 |
| 5,482,883 | * | 1/1996 | Rajeevakumar ..................... 438/434 |
| 5,504,034 | * | 4/1996 | Rapisarda ............................ 438/434 |
| 5,567,635 | * | 10/1996 | Acovic et al. ....................... 438/434 |
| 5,650,340 | * | 7/1997 | Burr et al. ........................... 438/433 |

FOREIGN PATENT DOCUMENTS 401-171266-A * 6/1989 (JP) ............................... H01I/27/10

* cited by examiner

*Primary Examiner*—Charles Bowers
*Assistant Examiner*—David S Blum
(74) *Attorney, Agent, or Firm*—Fleshner & Kim, LLP

(57) ABSTRACT

A semiconductor device and a fabrication method thereof which are capable of achieving a lightly doped drain (LDD) construction and reducing a parasitic capacitance generated between an impurity area and a word line by forming a trench in a portion of a semiconductor substrate and forming impurity areas around the trenches, include a semiconductor substrate, a plurality of trenches formed in the semiconductor substrate, first impurity areas formed along the outer surfaces of the plurality of trenches, second impurity areas formed on the bottom surfaces of the first impurity areas along the outer surfaces of the trenches, an insulating film filled in the trenches, a gate insulating film formed at a regular interval on the substrate having the insulating film filled in the trenches, and a gate electrode formed on the gate insulating film.

24 Claims, 4 Drawing Sheets

FABRICATION METHOD OF SEMICONDUCTOR MEMORY DEVICE WITH IMPURITY REGIONS SURROUNDING RECESS

This application is a Divisional of application Ser. No. 08/773,510 filed Dec. 23, 1996, now U.S. Pat. No. 5,990,529.

BACKGROUND OF THE INVENTION

1. Field of the Invention

The present invention relates to a semiconductor memory device and a fabrication method thereof, and in particular, to an improved semiconductor memory device and a fabrication method thereof which is capable of achieving a lightly doped drain (LDD) construction and reducing a parasitic capacitance generated between an impurity area and a word line by forming a trench in a portion of a semiconductor substrate and forming an impurity area around the trench.

2. Description of the Prior Art

FIG. 1 is a plan view of a layout of a semiconductor memory device according to the conventional art, and FIG. 2 is a longitudinal cross-sectional view of the semiconductor memory device in FIG. 1. As shown in these drawings, a semiconductor substrate 1 is formed having a plurality of (N+) impurity areas (2s, 2d) on the upper portion thereof 1, and on the plurality of impurity areas (N+) (2s, 2d), a gate oxide film 3 is formed. On the gate oxide film 3, a plurality of polysilicon lines 4 are sequentially formed. The polysilicon lines 4 which serve as word lines are formed to cross the plurality of (N+) impurity areas (2s, 2d). And, a polysilicide layer 5 is formed on the polysilicons 4.

In the above-described semiconductor memory device according to the conventional art, since as many capacitors as the (N+) impurity areas (2s,2d) (which are parasitic capacitors) are formed between the (N+) impurity areas (2s,2d) and the polysilicon lines 4 formed on the semiconductor substrate 1, the delay time of the word lines is disadvantageously increased due to the parasitic capacitors, and it is difficult to reduce the size of a cell due to a lateral diffusion of the (N+) impurity areas (2s,2d). Furthermore, since the (N+) impurity areas (2s,2d) serve as the source and drain of a transistor, a semiconductor memory device having the LDD construction is impossible to fabricate.

SUMMARY OF THE INVENTION

Accordingly, it is an object of the present invention to provide an improved semiconductor memory device and a fabrication method thereof which is capable of lessening the parasitic capacitance formed due to polysilicon and (N+) impurity areas.

It is another object of the present invention to provide an improved semiconductor memory device and a fabrication method thereof which is capable of fabricating a semiconductor memory device having an LDD construction.

It is still another object of the present invention to provide an improved semiconductor memory device and a fabrication method thereof which is capable of reducing the size of a memory cell of a semiconductor device by preventing a lateral diffusion of an impurity area on a semiconductor substrate.

To achieve the above object, there is provided an improved semiconductor memory device which includes a semiconductor substrate, a plurality of trenches formed in the semiconductor substrate, first impurity areas formed along the outer surfaces of each of the plurality of trenches, second impurity areas formed under a bottom surfaces of each first impurity area along the outer surfaces of the trenches, an insulating film filled in each trench, a gate insulating film formed at a regular interval on the substrate having the insulating film filled in the trench, and a gate electrode formed on the gate insulating film.

To achieve the above object, there is provided an improved fabrication method for a semiconductor memory device which includes the steps of forming a plurality of trenches in a semiconductor substrate, forming a first impurity area around each trench, forming a second impurity area beneath each first impurity area, filling the trenches with an insulating film, forming a gate insulating film at a regular interval on the substrate having the insulating film filled in the trenches, and forming a gate electrode on the gate insulating film.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
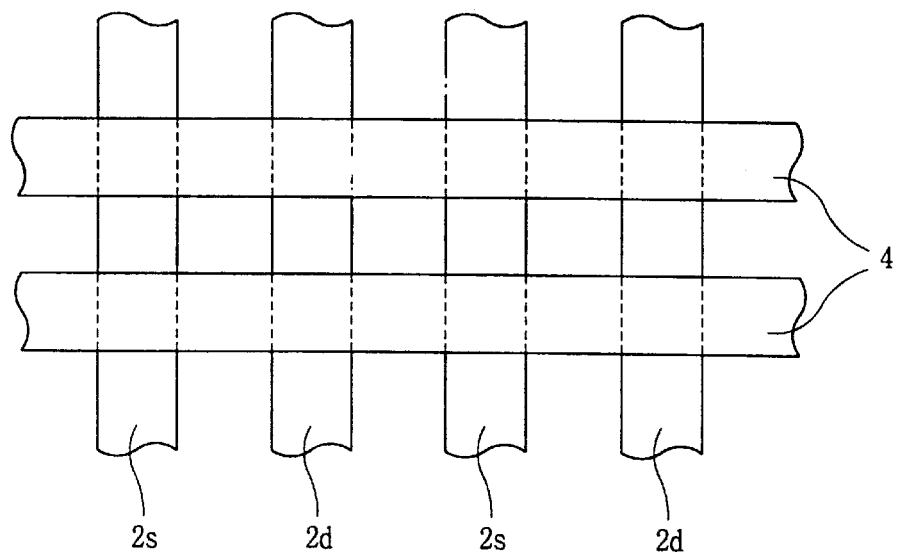
FIG. 1 is a plan view of a layout of a semiconductor memory device according to the conventional art.
Figure 2:
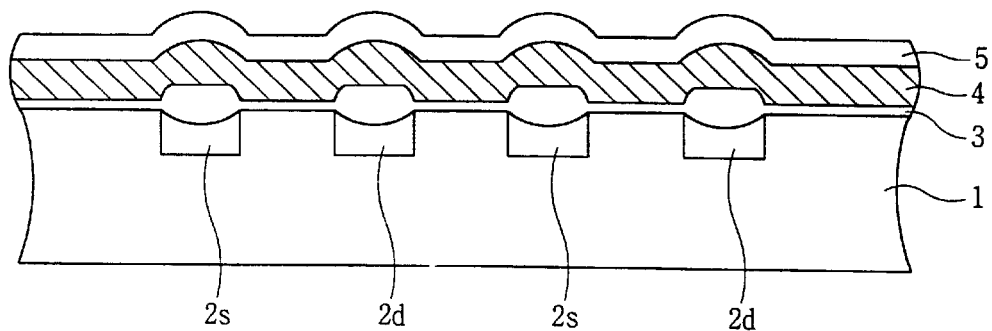
FIG. 2 is a longitudinal cross-sectional view of the semiconductor memory device in FIG. 1 according to the conventional art.
Figure 3:
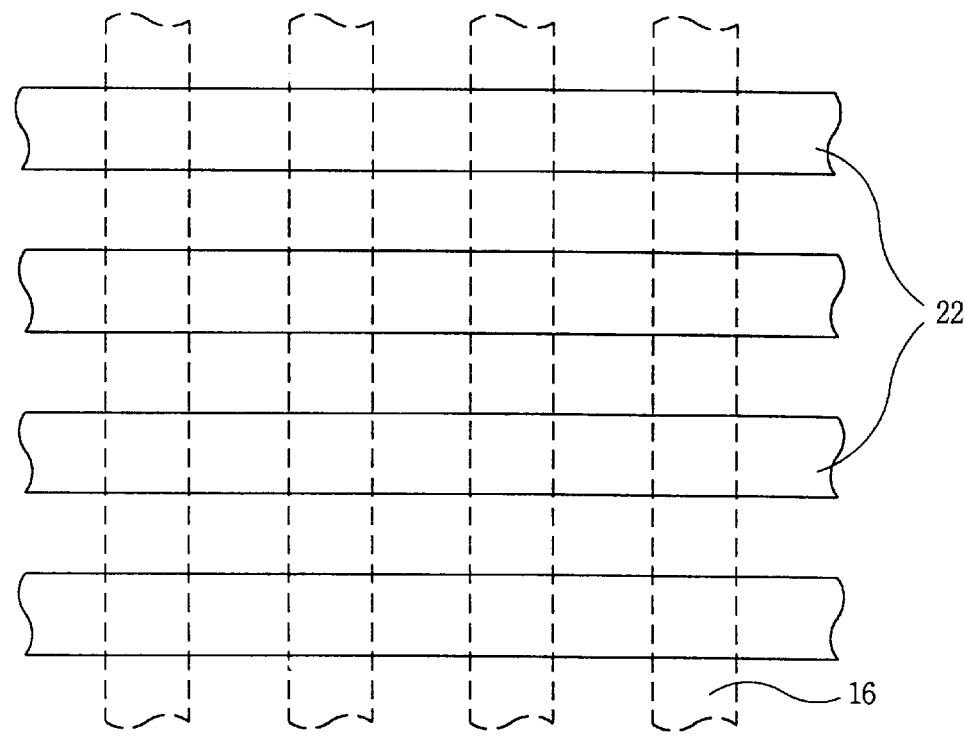
FIG. 3 is a plan view of a semiconductor memory device according to the present invention.

FIG. 3 is a plan view of a semiconductor memory device according to the present invention. As shown in this drawing, bit lines 16 and word lines 22 are formed in the trenches on a semiconductor substrate 11.

Figure 4:
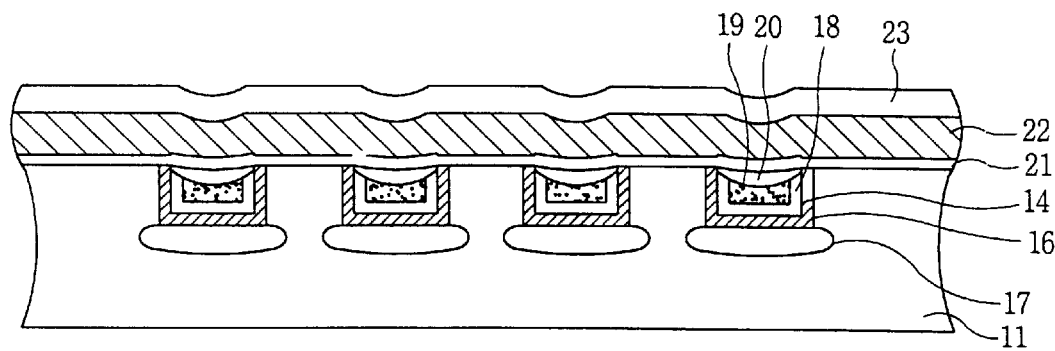
FIG. 4 is a longitudinal cross-sectional view of the semiconductor memory device in FIG. 3 according to the present invention.

FIG. 4 is a longitudinal cross-sectional view of the semiconductor memory device in FIG. 3. As shown in this drawing, the semiconductor memory device includes a first conductive semiconductor substrate 11, a plurality of trenches 14 formed in the semiconductor substrate 11, first impurity areas 16 formed along the outer surfaces of each of the plurality of trenches 14, second impurity areas 17 formed under the outer bottom surfaces of the first impurity areas 16, a first CVD oxide film 18 formed on the inside walls and the inner lower surface in the trenches 14, an SOG (spin on glass) layer 19 filled in the first oxide film 18 in the trench 14, a second CVD oxide film 20 formed on the SOG layer 19, a gate oxide film 21 formed at a regular interval on the semiconductor substrate 11 having the second oxide film 18, and a conductive layer serving as a gate electrode formed on the gate oxide film.

The conductive layer is formed by the sequential deposition of a polysilicon 22 and a polysilicide 23.

FIGS. 5A through 5H show a fabrication method for the semiconductor memory device in FIG. 4, and the fabrication steps will now be described in detail.

Figure 5A:
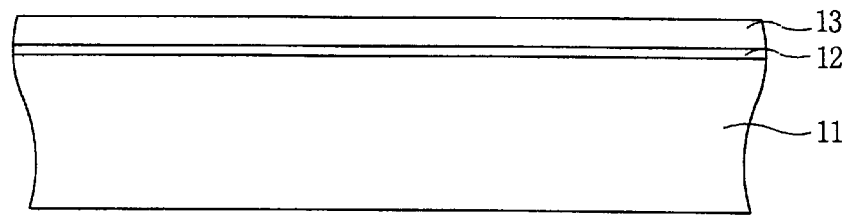
FIGS. 5A through 5H are views showing a fabrication method for a semiconductor memory device according to the present invention.
Figure 5B:
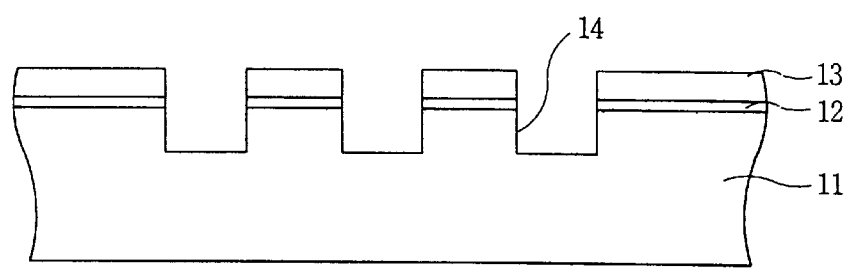

First, as shown in FIGS. 5A and 5B, a relief oxide film 12 which is to serve as an insulating layer is deposited to have a thickness of about 400 Å on the first conductive semiconductor substrate 11, and then a nitride film 13 is deposited to have a thickness of about 1600 Å by a low pressure chemical vapor deposition (LPCVD). Then, by a photolithography process, an insulating layer including the nitride film 13 and the oxide film 12 is patterned to expose a predetermined portion of the semiconductor substrate, and a plurality of trenches 14 are formed by etching the semiconductor substrate 11, using the patterned insulating layer as a mask.

Figure 5C:
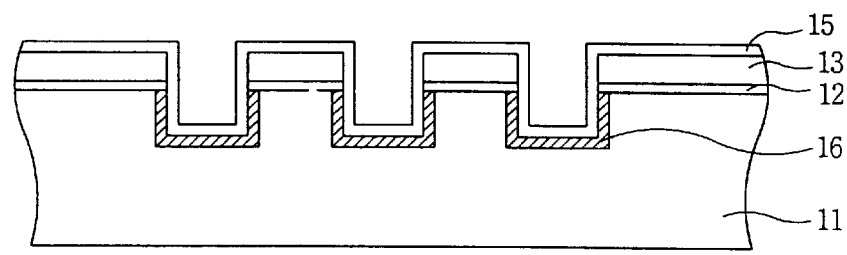
Figure 5D:
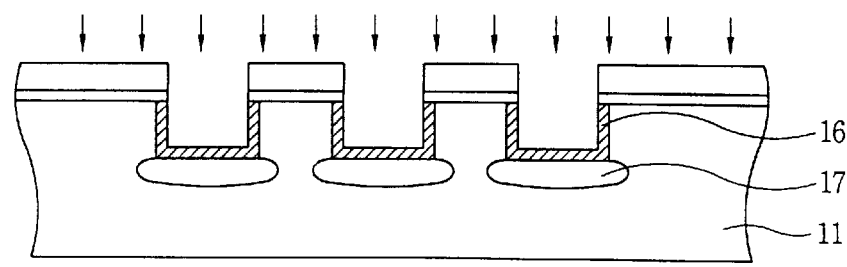

Next, as shown in FIGS. 5C and 5D, after a CVD PSG (phosphorous silicate glass) (n−) 15 is deposited to cover the entire resultant uneven surface formed by the above process, an annealing is performed on the resultant structure at the temperature of about 800~1000° C. so that phosphorus is diffused into the semiconductor substrate 11 to form the first impurity area (n−) 16 along the outer outline of the trenches 14. Then, after the CVD PSG film 15 is stripped, an (n+) ($5 \times 10^{15}$) inpurity is implanted by 0° tilting, using the insulating layer as a mask, so that the second impurity area (n+) 17 is formed beneath the first impurity area (n−) 16.

Figure 5E:
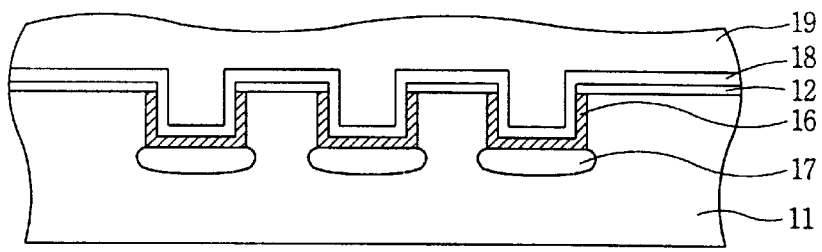
Figure 5F:
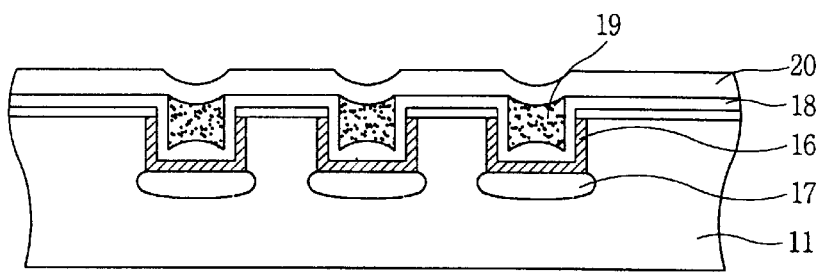

Next, as shown in FIGS. 5E and 5F, after the nitride film 13 which serves as an insulating layer is stripped, a first CVD oxide film 18 is deposited to have a thickness of about 1000 Å to cover the entire resultant surface formed by the above process. By coating the resultant surface with an SOG(spin on glass) for a planarization and curing the same at a temperature of 650° C., an SOG layer 19 is formed in such a manner that the entire surface is covered and the trenches 14 are filled, and then the SOG layer 19 is etched back so that the SOG layer 19 remains on the first oxide film 18 inside the trenches 14. A second CVD film 20 is deposited to have a thickness of 2000 Å on the first CVD film 18, including the upper surface of the remaining SOG layer 19.

Figure 5G:
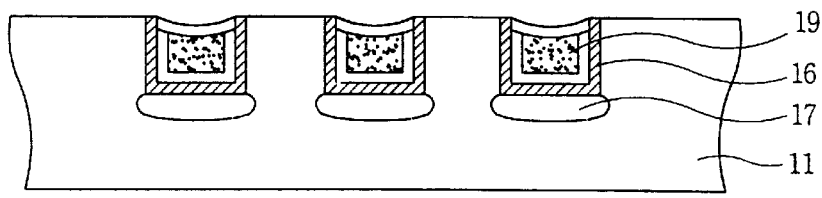
Figure 5H:
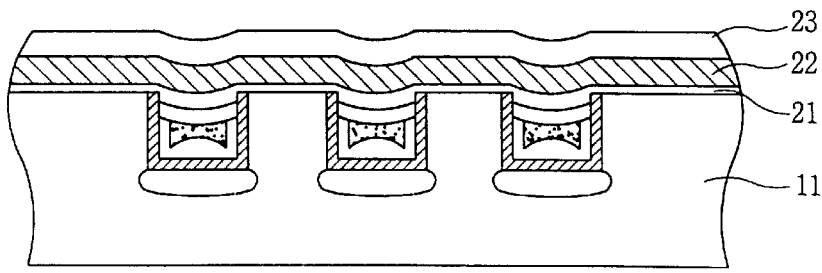

Next, as shown in FIGS. 5G and 5H, the first and second CVD oxide films 18,20 are etched back, and then about 100~150 Å of the gate oxide film 21, about 1000~2500 Å of the polysilicon layer 22 which serves as a gate electrode and about 1000~2000 Å of the polysilicide(WSi$_2$) layer 23 are sequentially deposited.

As described above, in the semiconductor memory device according to the present invention, by forming the respective impurity areas(n−,n+) in the semiconductor substrate, the fabrication of the semiconductor memory device having an LDD construction can be achieved.

Therefore, the present invention has the advantages as follows:

The reduction of the size of the semiconductor memory device can be accomplished since the lateral diffusion of impurities is decreased in comparison with the conventional device.

A parasitic capacitance and the delay time of the word lines can be reduced since a thick insulating layer is formed between the polysilicon lines(word line) and the impurity areas.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for a semiconductor memory device, comprising:

forming a plurality of trenches in a semiconductor substrate, wherein each trench has first and second sidewalls;

forming a first impurity area around each trench, wherein each first impurity area continuously extends on the first and second sidewalls of said each trench to connect and form a unitary region;

filling the trenches with an insulating film;

forming gate insulating films at regular intervals on the substrate having the insulating film filled in the trenches; and forming a gate electrode on each of the gate insulating films, wherein each of the unitary regions form one of a single source region and a single drain region for a corresponding gate electrode of the gate electrodes.

2. The fabrication method of claim 1, wherein the forming of the trenches comprises:

forming an oxide film on the substrate and a nitride film on the oxide film; and patterning the oxide and nitride films to expose a portion of the substrate; and etching the substrate using the patterned oxide and nitride films.

3. The fabrication method of claim 1, wherein the filling of the trenches with an insulating film comprises:

forming an insulating film on the substrate having the trenches at a regular interval therein; and etching back the insulating film.

4. The fabrication method of claim 1, wherein the second impurity area is formed by a 0° tilting ion implantation.

5. The fabrication method of claim 1, wherein the gate electrode is formed by a sequential deposition of a polysilicon and a polysilicide.

6. The fabrication method of claim 1, wherein the insulating film comprises PSG (phosphorus silicate glass), and wherein the first impurity area is formed by performing an annealing at a temperature of 800~1000° C. so that phosphorus is diffused into the semiconductor substrate.

7. The fabrication method of claim 3, wherein the forming of the insulating film comprises:

forming a first oxide film;

forming an SOG (spin on glass) layer on the first oxide film; and forming a second oxide film on the SOG layer.

8. The fabrication method of claim 1, wherein a doping element of the first impurity area is one of As and Pb.

9. The fabrication method of claim 1, wherein said each trench has a bottom connecting the first and second sidewalls, wherein said each first impurity unitary region extends under the bottom to connect the first impurity areas continuously extending on the first and second sidewalls, respectively, and wherein the first impurity unitary region is "U"-shaped.

10. The fabrication method of claim 1, further comprising forming a second impurity area beneath each first impurity area.

11. The fabrication method of claim 10, wherein a concentration of the first impurity area is lower than that of the second impurity area.

12. The fabrication method of claim 10, wherein the plurality of trenches are formed along a first direction, the gate insulating films are formed at regular intervals along a second direction, and wherein the second direction is substantially perpendicular to the first direction.

13. The fabrication method of claim 10, wherein the first and second impurity areas serve as bitlines, and wherein the gate electrodes form wordlines.

14. A fabrication method for a semiconductor memory device, comprising:

forming a plurality of recess means in a semiconductor substrate;

forming a plurality of impurity regions, wherein each of the impurity regions continuously surrounds one of the recess means to serve as one of a source region and a drain region;

filling the plurality of recess means with an insulating film;

forming a gate insulating film on the substrate; and forming a gate electrode on each of the gate insulating films.

15. The fabrication method of claim 14, wherein the forming of the plurality of recess means comprises:

forming an oxide film on the substrate and a nitride film on the oxide film; and patterning the oxide and nitride films to expose a portion of the substrate; and etching the substrate using the patterned oxide and nitride films.

16. The fabrication method of claim 14, wherein the filling of the plurality of recess means with an insulating film comprises:

forming an insulating film on the substrate having the plurality of recess means formed at a regular interval therein; and etching back the insulating film.

17. The fabrication method of claim 16, wherein the forming of the insulating film comprises:

forming a first oxide film;

forming an SOG (spin on glass) layer on the first oxide film; and forming a second oxide film on the SOG layer.

18. The fabrication method of claim 14, wherein each of the plurality of recess means comprises side surfaces and a bottom surface, and wherein forming each of the plurality of impurity regions comprises:

forming a first impurity region adjacent an entire surface of a side surface and the bottom surface of said each of the plurality of recess means; and forming a second impurity region adjacent to the first impurity region on the bottom surface of the first impurity region, wherein the concentration of impurities in the first impurity region is lower than the concentration of impurities in the second impurity region.

19. The fabrication method of claim 14, wherein the plurality of recess means are formed along a first direction, the gate insulating film is formed at regular intervals along a second direction, and wherein the second direction is substantially perpendicular to the first direction, and wherein two consecutive impurity regions of the plurality of impurity regions respectively form a source and a drain for a corresponding gate electrode.

20. A fabrication method for a semiconductor device, comprising:

forming a plurality of first signal lines at regular intervals on a semiconductor substrate in a first direction; and forming a plurality of trenches in the semiconductor substrate along a second direction substantially perpendicular to the first direction, wherein the trenches form second signal lines, wherein each of the plurality of trenches comprises, forming impurity areas, wherein each of the impurity areas is formed along side and bottom surfaces of each of the plurality of trenches to surround said each of the plurality of trenches, wherein each of the impurity areas formed surrounding said each of the plurality of trenches form one of a single source and a single drain region, and filling said each of the plurality of trenches with an insulating film.

21. The fabrication method of claim 20, wherein forming each of the plurality of first signal lines comprises:

forming gate insulating films at regular intervals on the semiconductor substrate in the first direction on the insulating films filled in the trenches; and forming gate electrodes on the gate insulating films.

22. The fabrication method of claim 20, wherein the first and second signal lines comprise wordlines and bitlines, respectively, and wherein a selected wordline forms a pair of bitlines by forming a channel in the semiconductor substrate between two adjacent corresponding trenches.

23. The fabrication method of claim 20, wherein the forming of the impurity areas comprises:

forming a unitary continuously extending first impurity region by forming first impurity areas along all sides and bottom surfaces of said each of the plurality of trenches; and forming second impurity areas under the bottom surface of said each of the trenches, and wherein forming of each insulating film comprises, forming a first oxide film, forming an SOG layer on the first oxide film, and forming a second oxide film on the SOG layer.

24. The fabrication method of claim 20, wherein said all side surfaces are formed with a first side and a second side that intersect at the bottom surface.

* * * * *